United States Patent [19]
Hsu et al.

[11] Patent Number: 6,071,812
[45] Date of Patent: Jun. 6, 2000

[54] METHOD OF FORMING A MODIFIED METAL CONTACT OPENING TO DECREASE ITS ASPECT RATIO FOR DEEP SUB-MICRON PROCESSES

[75] Inventors: Shou-Yi Hsu; Hon-Hung Lui; Kun-Jung Chuang, all of Hsin-Chu, Taiwan

[73] Assignee: Taiwan Semiconductor Manufacturing Company, Hsin-Chu, Taiwan

[21] Appl. No.: 09/174,622

[22] Filed: Oct. 19, 1998

[51] Int. Cl.[7] .................. H01L 21/44; H01L 21/4763; H01L 21/31; H01L 21/469
[52] U.S. Cl. ................ 438/668; 438/666; 438/620; 438/618; 438/778
[58] Field of Search ................... 438/668, 666, 438/620, 618, 652, 783, 778, 642

[56] References Cited

U.S. PATENT DOCUMENTS

| | | | |
|---|---|---|---|
| 5,371,042 | 12/1994 | Ong | 437/194 |
| 5,629,237 | 5/1997 | Wang et al. | 438/701 |
| 5,686,354 | 11/1997 | Avanzino et al. | 437/190 |
| 5,861,343 | 1/1999 | Tseng | 438/666 |

*Primary Examiner*—Wael Fahmy
*Assistant Examiner*—Neal Berezny
*Attorney, Agent, or Firm*—George O. Saile; Stephen B. Ackerman; Willliam J. Stoffel

[57] ABSTRACT

A method of fabricating a metal contact in a reduced aspect ratio contact hole. The method begins by forming a first insulating layer and a first barrier layer having a first barrier opening over a substrate. The first insulating layer is anisotropically etched through the first barrier opening forming an upper contact hole. A second barrier layer is formed on the first barrier layer and the first insulating layer. The second barrier layer is anisotropically etched forming spacers on sidewalls of the first insulating layer. The first insulating layer is anisotropically etched using the first barrier layer and the spacers as an etch mask forming a lower contact hole. The first barrier layer and the spacers are removed to form the reduced aspect ratio contact hole. The reduced aspect ratio contact hole is comprised by the upper and lower contact holes. The reduced aspect ratio contact hole is filled with a contact metal to contact the contact region in the substrate.

18 Claims, 6 Drawing Sheets

METHOD OF FORMING A MODIFIED METAL CONTACT OPENING TO DECREASE ITS ASPECT RATIO FOR DEEP SUB-MICRON PROCESSES

BACKGROUND OF INVENTION

1) Field of the Invention

This invention relates generally to the fabrication of contact openings in semiconductor devices and more particularly to a method for forming a contact opening that has a reduced aspect ratio in an insulating layer that exposes a substrate.

2) Description of the Prior Art

High density integrated circuit technology requires the use of an insulating layer separating layers of metal electrode patterns formed over a semiconductor substrate containing device elements. Contact holes must be formed in the insulating layer to formed electrical connection to the contact areas in the semiconductor substrate. These contact opening require good metal step coverage to insure reliable electrical contact with low contact resistance. For high density circuits, good metal step coverage requires a contact via hole openings with lower effective aspect ratios.

FIG. 11 shows a conventional (prior art) contact hole 17 through an insulating layer to expose a contact area in the substrate. Generally in semiconductor products, the aspect ratio is less than or equal to 3 (depth to width ratio). However, for the inventor's recent DRAM and embedded DRAM products, due to high heights in the cell area, very high aspect ratios up to 7 are now being formed. However, the conventional straight contact hole causes problems and can not be used when aspect ratios much above 3 are used. When sputtered Ti or TiN barrier layers are formed over the contact hole, the Ti or TiN layer has a high resistance and a poor profile at the sidewalls and bottom.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 5,629,237 (Wang) that shows a method of forming a tapered contact hole using a dry etch process.

U.S. Pat. No. 5,371,042 (Ong) shows a method for forming a contact hole having faceted top corners.

U.S. Pat. No. 5,686,354 (Avanzino et al.) shows a dual damascene process to from a via using a spacer.

There is still a need to form contact holes which allow better metal coverage with minimizing the contact area to the substrate.

SUMMARY OF THE INVENTION

It is an object of the present invention to provide a method for fabricating a contact hole that has a reduced aspect ratio.

It is an object of the present invention to provide a method for fabricating a contact hole that has a reduced aspect ratio that uses only one photoresist masking step.

To accomplish the above objectives, the present invention provides a method of forming a contact opening having a reduced aspect ratio. The general process of the invention is illustrated in two embodiments.

The first embodiment forms a reduced aspect ratio contact hole 30 38 comprised of an upper contact hole 30 and a lower contact hole 38 (See FIG. 7). The lower opening 38 is formed using a spacer 34A and an etch step as shown in FIGS. 5 and 6. The upper contact hole 30 reduces the overall aspect ratio of the contact hole 30 38. This improves the etch process and the metal fill/metal barrier layer processes (e.g., sputter).

The second embodiment creates a contact hole comprised of 3 different width openings 130 149 151 that are formed using 2 spacers. (See FIGS. 8, 9 & 10).

The method of the invention can repeated any number of times to create a contact hole comprised of any number of different width openings (each successive opening having a smaller width than the previous opening) that are formed using any number of spacers. The basic process of the invention—① spacer formation (*E.g., FIGS. 3 & 4), ② etch narrower opening (e.g., FIG. 5), and ③ spacer formation (FIGS. 3 & 4) . . . .—can be repeated any number of times to create the desired contact hole having a desired aspect ratio.

The table in FIG. 11 shows an example of the reduction of the aspect ratio of the invention's contact hole. The numbers (1 thru 7) in the table refer to the relative dimensions (depths and widths) of the contact holes. The prior art's contact opening 17 has an aspect ratio of 7. In contrast, the 1st embodiment of the invention has the same bottom width 1 and overall depth 3+4=7, but only has an aspect ratio of 5.

The invention provides the following benefits:

forms a contact opening having a reduced aspect ratio.

forms the contact opening having a reduced aspect ratio using only one photoresist masking step.

Additional objects and advantages of the invention will be set forth in the description that follows, and in part will be obvious from the description, or may be learned by practice of the invention. The objects and advantages of the invention may be realized and obtained by means of instrumentalities and combinations particularly pointed out in the append claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

The present invention will be described in detail with reference to the accompanying drawings. The present invention provides a method of forming a contact opening having a reduced aspect ratio.

In the following description numerous specific details are set forth such as flow rates, pressure settings, thicknesses, etc., in order to provide a more thorough understanding of the present invention. It will be obvious, however, to one skilled in the art that the present invention may be practiced without these details. In other instances, well known process have not been described in detail in order to not unnecessarily obscure the present invention.

Figure 5:
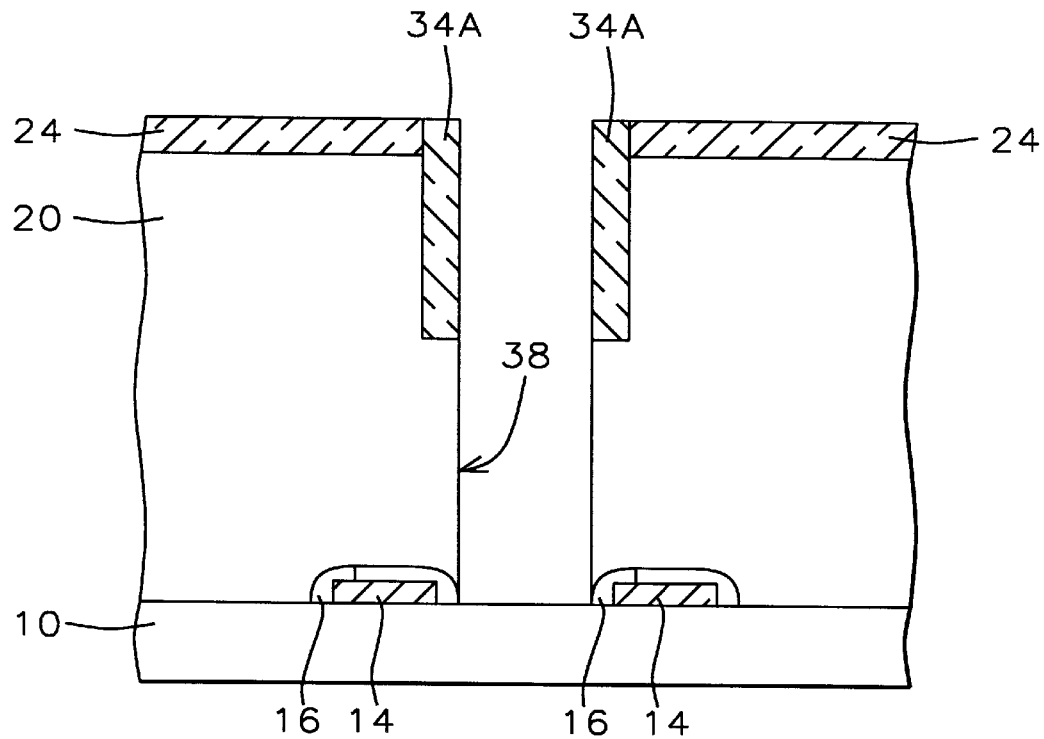
Figure 6:
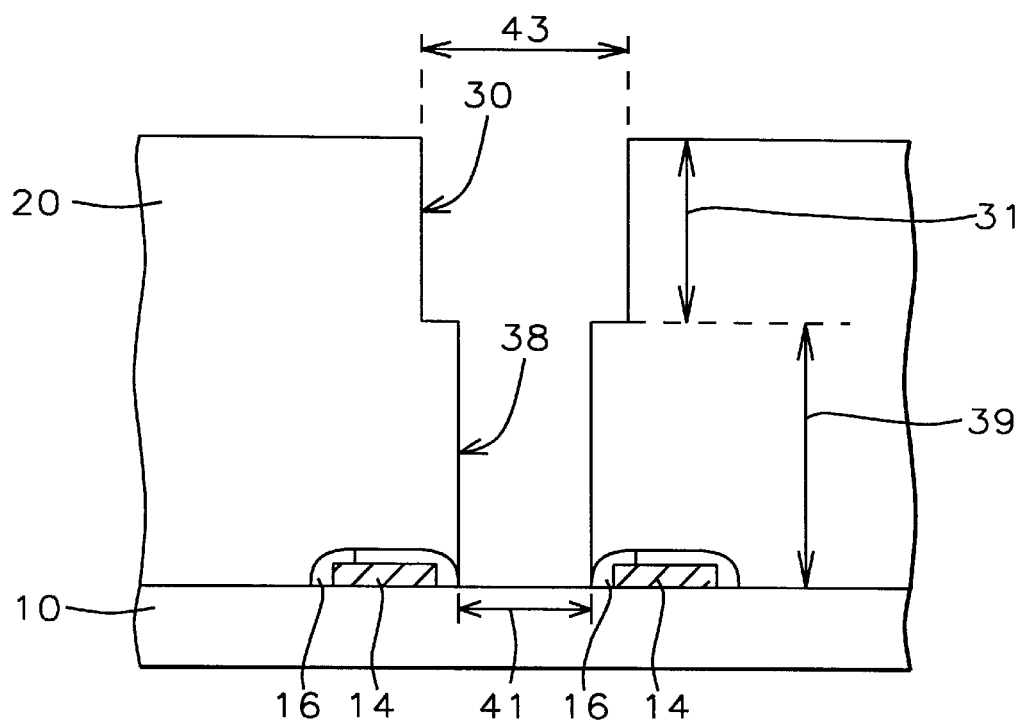
Figure 7:
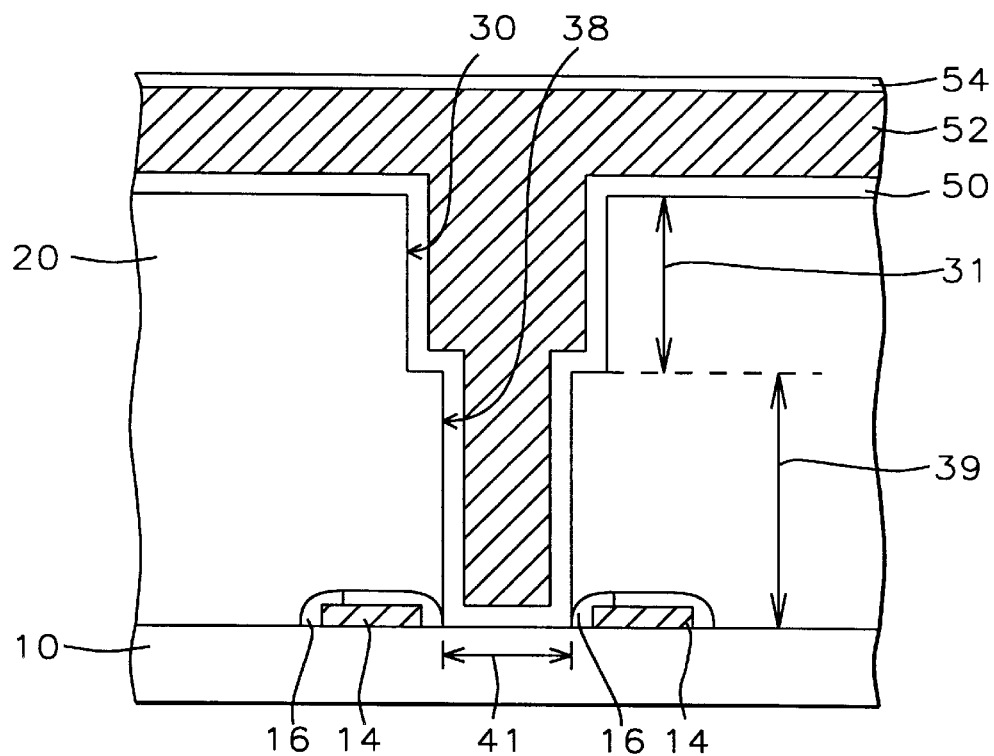

The first embodiment of the invention is shown in FIGS. 1 to 7. As shown in FIG. 7, the first embodiment forms a reduced aspect ratio contact hole 30 38 comprised of an upper contact hole 30 and a lower contact hole 38. The upper contact hole 30 reduces the overall aspect ratio of the contact hole 30 38. This improves the etch process and the metal fill processes.

Figure 8:
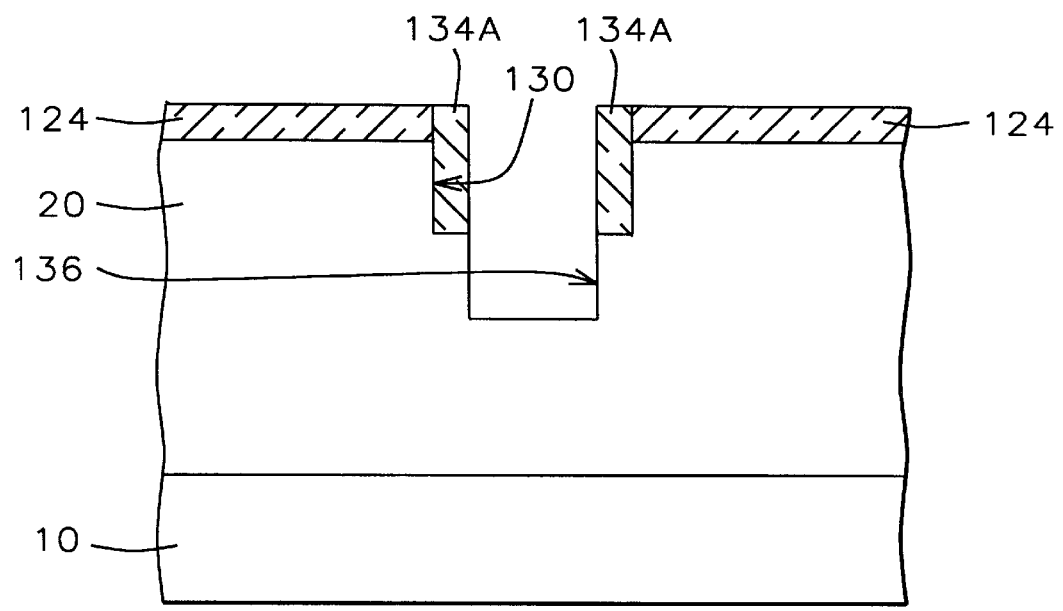
FIGS. 8, 9, and 10 are cross sectional views for illustrating a method for manufacturing a contact opening having a reduced aspect ratio according to the second embodiment present invention.
Figure 9:
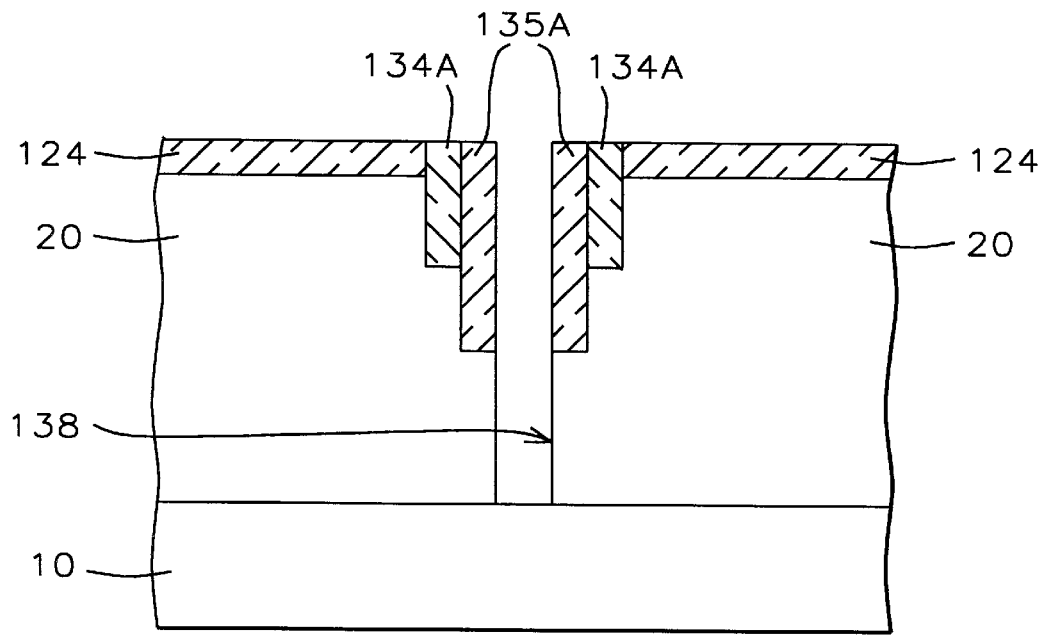
Figure 10:
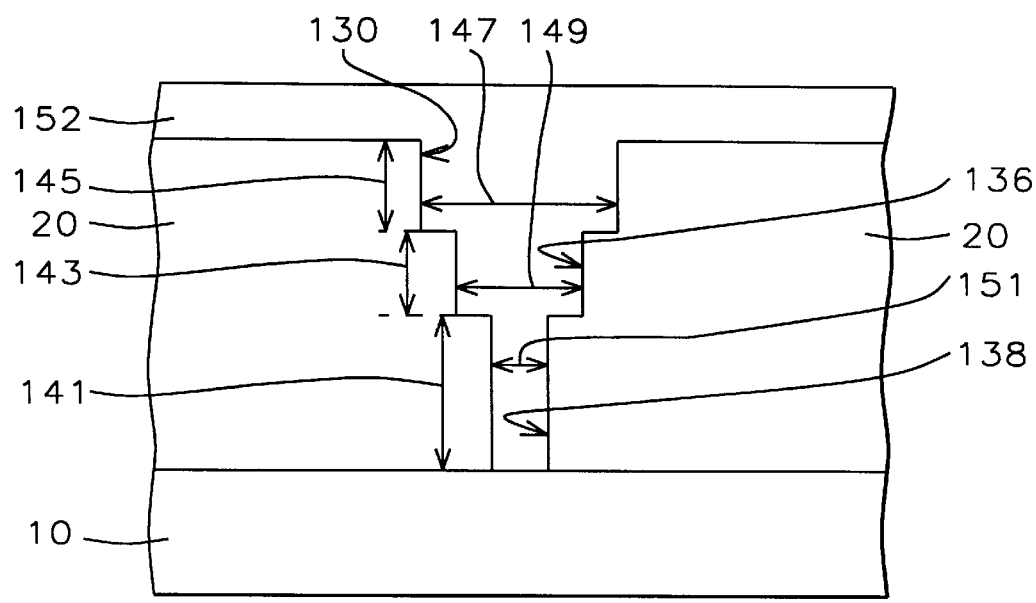

A second embodiment is shown in FIGS. 8, 9 and 10. The second embodiment creates a contact hole comprised of 3 different width openings 130 149 151 that are formed using 2 spacers.

The method of the invention can repeated any number of times to create a contact hole comprised of any number of different width openings (each successive opening having a smaller width than the previous) that are formed using any number of spacers. The basic process of the invention—spacer formation, etch narrower opening, spacer formation . . . .—can be repeated any number of times to create the desired contact hole having a desired aspect ratio.

It is important to understand that the invention does not form a dual damascene interconnect structure nor a via opening between metal lines through intermetal dielectric (IMD) layers. The invention forms only a contact structure (e.g., contact from substrate to the first metal layer, e.g., through inter-poly oxide (IPO), and interlevel dielectric (ILD) layers).

First Embodiment—Two Contact Openings 30 38

The first embodiment of the invention is shown in FIGS. 1 to 7. As shown in FIG. 7, the first embodiment forms a reduced aspect ratio contact hole 30 38 comprised of an upper contact hole 30 and a lower contact hole 38. The upper contact hole 30 reduces the overall aspect ratio of the contact hole 30 38. This improves the etch process and the metal file processes.

Figure 1:
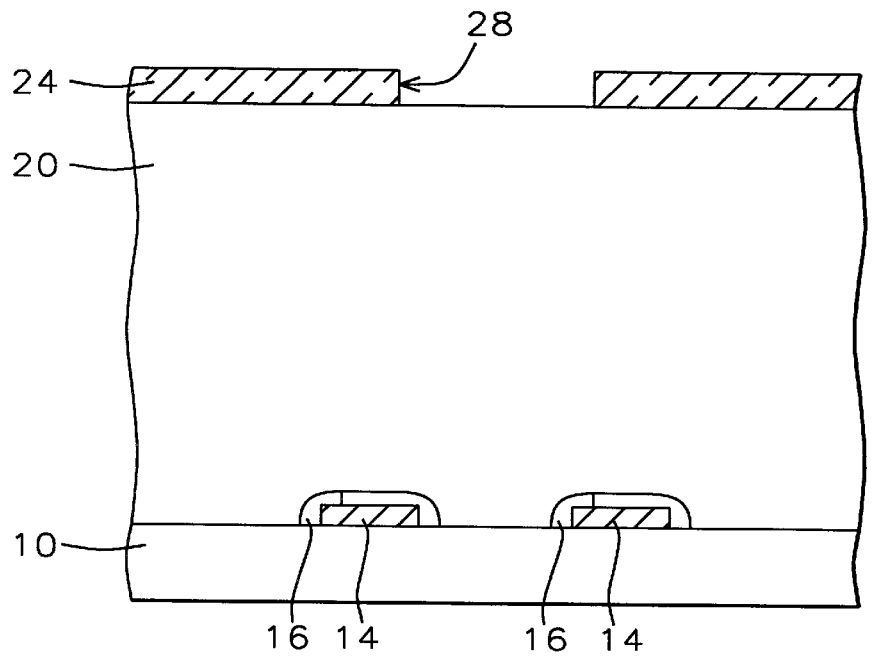
FIGS. 1, 2, 3, 4, 5, 6, and 7 are cross sectional views for illustrating a method for manufacturing a contact opening having a reduced aspect ratio according to the first embodiment present invention.

FIG. 1 shows the step of forming a first insulating layer 20 over a semiconductor substrate 10.

The substrate 10 has a contact region where the metal contact will be formed. Substrate 10 is understood to possibly include a semiconductor wafer, active and passive devices formed within the wafer and layers formed on the wafer surface.

Devices are formed in and on the substrate, such as gates 14 and dielectric layer 16. The first insulating layer 20 is preferably composed of silicon oxide; doped silicon oxide, phosphosilicate glass, or borophosphosilicate glass.

Next, a first barrier layer 24 is formed over the first insulating layer 20. The first barrier layer has a first barrier opening 28 over the contact region.

The first barrier layer 24 is preferably composed silicon nitride (SiN). The first barrier layer has a thickness in a range of between about 400 and 2000 Å.

The first insulating layer 20 and first barrier layer 24 are composed of materials that must have different etch characteristics so that they can be etched selectively to etch other. Other combinations of materials than the preferred ones are possible.

Figure 2:
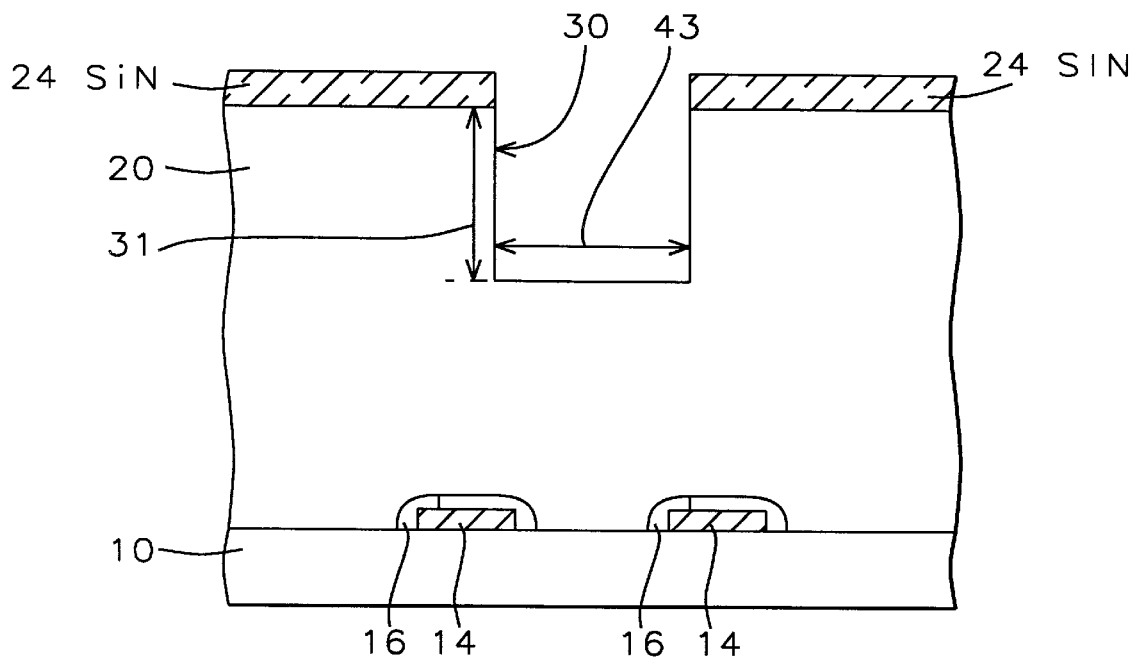

FIG. 2 shows the step of anisotropically etching the first insulating layer 20 through the first barrier opening 28 forming an upper contact hole 30. The upper contact hole preferably has a depth 31 in a range of between about 1000 and 8000 Å and a width 43 in a range of between about 0.3 and 1.0 m.

Figure 3:
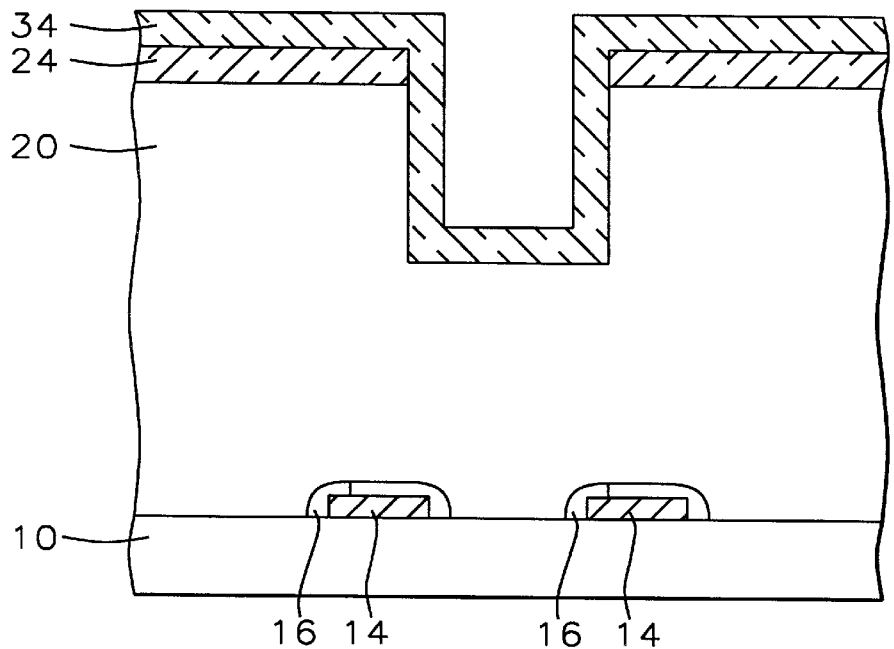

FIG. 3 shows the step of forming a second barrier layer 34 on the first barrier layer and the first insulating layer.

The second barrier layer 34 is preferably composed of silicon nitride (SiN). The second barrier layer preferably has a thickness in a range of between about 400 and 2000 Å and more preferably 1000 Å.

Figure 4:
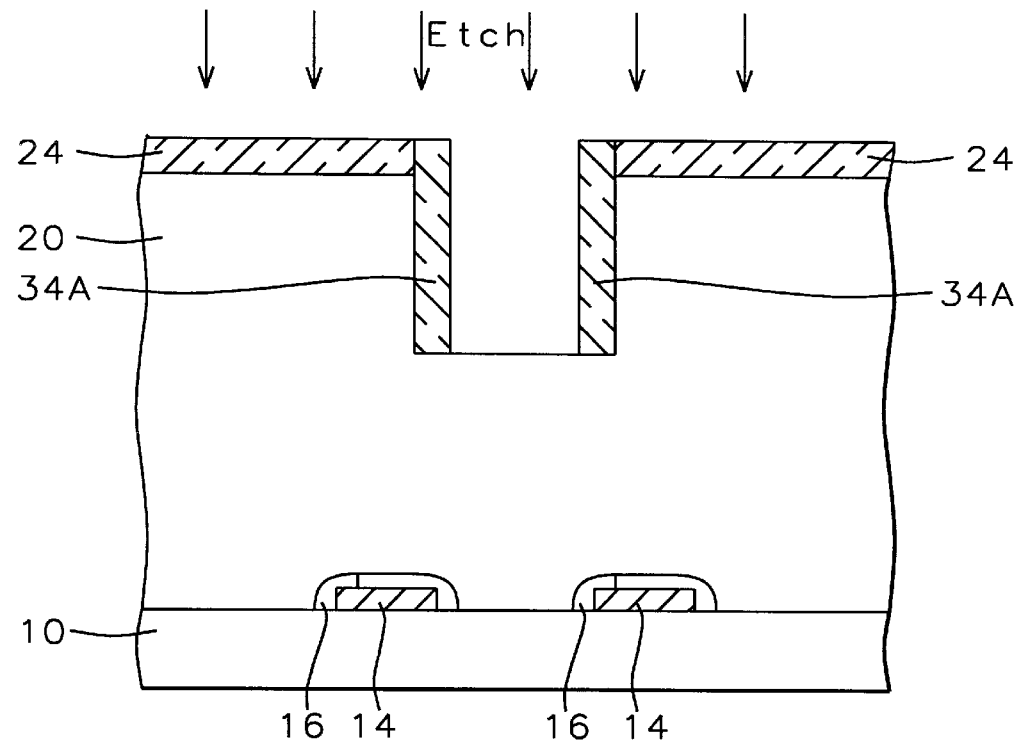

FIG. 4 shows the step of anisotropically etching the second barrier layer forming spacers 34A on sidewalls of the first insulating layer 20.

As shown in FIG. 5, the first barrier layer is anisotropically etched using the first barrier layer 24 and the spacers 34A as an etch mask forming a lower contact hole 38.

The lower contact hole 38 preferably has a width 41 in a range of between about 0.2 and 0.5 µm; and a depth 39 in a range of between about 1000 and 8000 Å.

Referring to FIG. 6, the first barrier layer 24 and the spacers 34A are removed to form the reduced aspect ratio contact hole 30 38. The first barrier layer 24 and the spacers 34A are preferably removed using a selective etch.

FIG. 7 shows the step of filling the reduced aspect ratio contact hole 30 38 with a conductive material (e.g., metal material, e.g., 50 52 54) to contact the contact region in the substrate.

The metal contact (e.g., 50 52 54) is preferably formed of a three layer structure comprising a lower Ti/TiN layer 50; a middle (Al alloy (e.g., AlCu) or W) layer 52 and a top titanium nitride (TiN) or Silicon oxynitride (SiON) layer 54.

2nd Embodiment—Three Contact Holes 130 136 138

A second embodiment of the invention forms the reduced aspect contact hole of 3 different width holes 130 136 138—widest on top 130 and narrowest width on bottom 138. See FIGS. 8, 9 and 10. The second embodiment uses a barrier layer 124 and 2 barrier layer spacers 134A 135A to define the 3 holes 130 136 138. Unless stated below, the second embodiment uses the same steps, techniques, processes and composition of analogous layers as taught above in the first embodiment.

FIG. 8 shows a first insulating layer 20 provided over a semiconductor substrate 10. The substrate has a contact region where the metal contact will be formed;

The first insulating layer 20 is preferably composed of a doped silicon oxide, phosphosilicate glass, borophosphosilicate glass, or $SiO_2$ and most preferably $SiO_2$.

A first barrier layer 124 is formed over the first insulating layer 20. The first barrier layer having a first barrier opening over the contact region.

FIG. 8 shows the step of anisotropically etching the first insulating layer 20 through the first barrier opening forming an upper contact hole 130. The upper contact hole 130 having a depth 145 in a range of between about 1000 and 8000 Å and a width 147 in a range of between about 0.4 and 1.0 µm.

Still referring to FIG. 8, a second spacer 134A is formed on the first spacer and on the sidewalls of the first insulating layer 20. The standard spacer process is used. A second barrier layer (not shown) is formed on the first barrier layer and the first insulating layer. The second barrier layer is preferably composed of silicon nitride and preferably has a thickness in a range of between about 400 and 2000 Å.

The second barrier layer is anisotropically etched forming first spacers 134A on sidewalls of the first insulating layer 20.

As shown in FIG. 8, the first insulating layer 20 is anisotropically etched using the first barrier layer 24 and the first spacers 134A as an etch mask forming a middle contact hole 136.

The middle contact hole 136 preferably has a depth 143 in a range of between about 1000 and 8000 Å. The middle contact hole 136 preferably has a width 149 in a range of between about 0.4 and 0.8 µm.

FIG. 9 shows the formation of second spacers 135A. A third barrier layer is formed over the first barrier layer, the first spacers 134A and the first insulating layer 20.

The third barrier layer is anisotropically etched forming second spacers 135A on the first spacers and on sidewalls of the first insulating layer in the middle contact hole 136. The second spacers preferably have a thickness in a range of between about 400 and 2000 Å.

Still referring to FIG. 9, the first insulating layer 20 is anisotropically etched using the first barrier layer 124, the first spacers 134A, and the second spacers 135A as etch mask forming a bottom contact hole 138.

Referring to FIG. 10, the bottom contact hole 138 preferably has a width 151 in a range of between about 0.2 and 0.5 µm and a depth 141 in a range of between about 1000 and 8000 Å.

As shown in FIG. 10, the first barrier layer 124, the first spacers 34A, and the second spacers 138 are removed forming a reduced aspect ratio contact hole 130 136 138 exposing the substrate 10. The spacers are preferably removed in a selective etch comprising hot $H_3PO_4$.

FIG. 10 shows the forming a metal contact 152 filling the reduced aspect ratio contact hole 130 136 138 contacting the substrate. The metal contact 152 can be formed as described above in the $1^{st}$ embodiment as a 3 layer structure.

Figure 11:
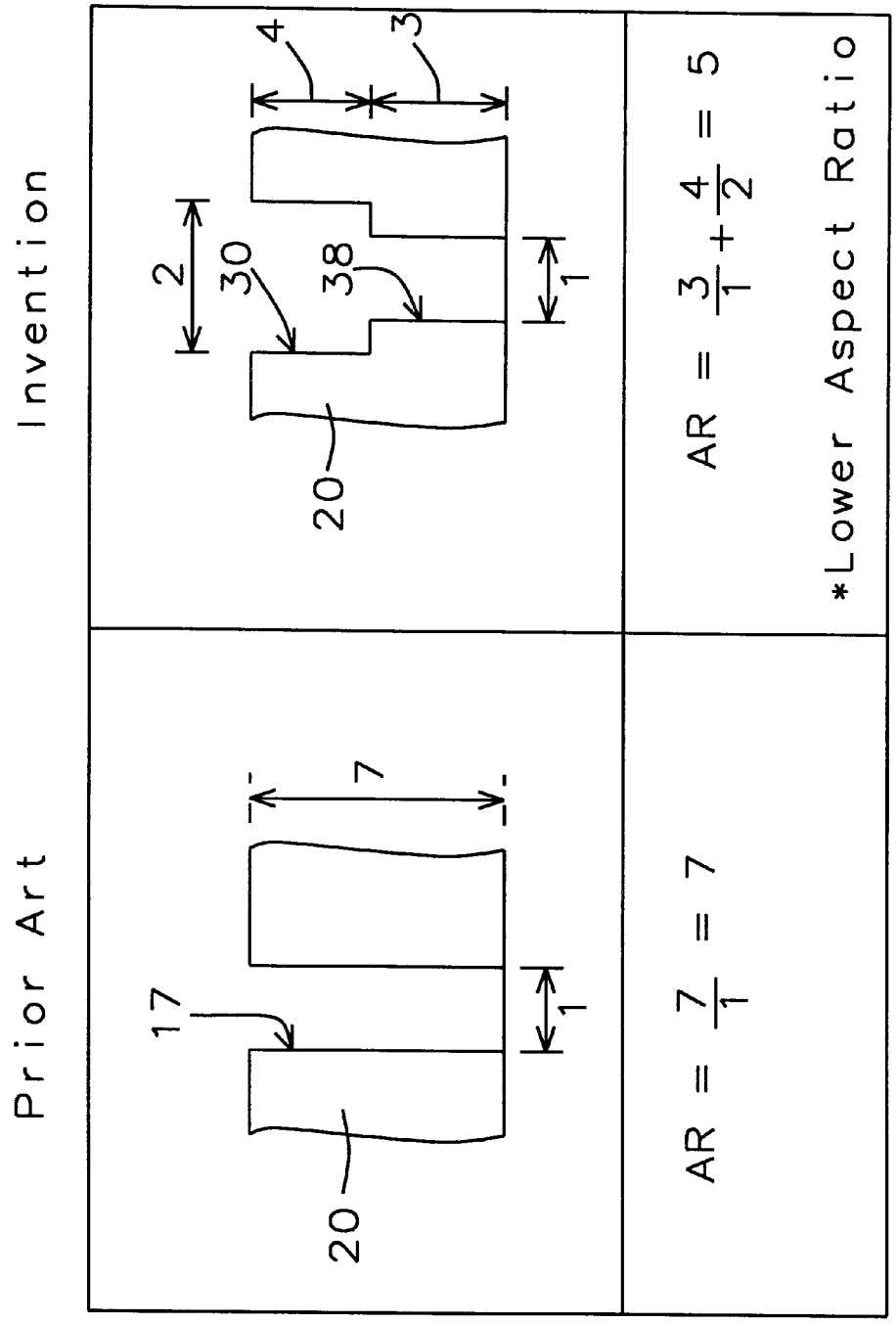
FIG. 11 is a table showing the invention's reduction in aspect ratio compared to a prior art's contact hole.

The table in FIG. 11 shows an example of the reduction of the aspect ratio of the invention's contact hole (1st embodiment). The numbers 1 through 7 in the table refer to the relative dimensions (depths and widths) of the contact holes. The prior art's contact opening 17 has an aspect ratio of 7. In contrast, the 1st embodiment of the invention has the same bottom width 1 and overall depth 3+4=7, but only has an aspect ratio of 5.

The invention provides the following benefits:

forms a contact opening having a reduced aspect ratio.

forms the contact opening having a reduced aspect ratio using only one photoresist masking step.

The invention allows metal contact barrier layer (e.g., sputtered Ti, TiN) to be formed with good profiles because of the effectively lowered Aspect ratio for the same small diameter lower opening.

It should be recognized that many publications describe the details of common techniques used in the fabrication process of integrated circuit components. Those techniques can be generally employed in the fabrication of the structure of the present invention. Moreover, the individual steps of such a process can be performed using commercially available integrated circuit fabrication machines. As specifically necessary to an understanding of the present invention, exemplary technical data are set forth based upon current technology. Future developments in the art may call for appropriate adjustments as would be obvious to one skilled in the art.

While the invention has been particularly shown and described with reference to the preferred embodiments thereof, it will be understood by those skilled in the art that various changes in form and details may be made without departing from the spirit and scope of the invention.

What is claimed is:

1. A method of fabricating a metal contact in a reduced aspect ratio contact hole to a substrate of a semiconductor device comprising the steps of:
    a) forming a first insulating layer over a substrate; said substrate having a contact region where said metal contact will be formed;
    b) forming a first barrier layer over said first insulating layer; said first barrier layer having a first barrier opening over said contact region;
    c) anisotropically etching said first insulating layer through said first barrier opening forming an upper contact hole; said upper contact hole defined by sidewalls of said first insulating layer; said upper contact hole extends partially through said first insulating layer;
    d) forming a second barrier layer on said first barrier layer and said first insulating layer;
    e) anisotropically etching said second barrier layer forming spacers on sidewalls of said first insulating layer;
    f) anisotropically etching said first insulating layer using said first barrier layer and said spacers as an etch mask forming a lower contact hole; said lower contact hole exposing said contact region of said substrate;
    g) removing said first barrier layer and said spacers; said upper contact hole and said lower contact hole comprise said reduced aspect ratio contact hole.

2. The method of claim 1 wherein which further includes: filling said reduced aspect ratio contact hole with a metal contact to contact said contact region in said substrate.

3. The method of claim 1 wherein which further includes: filling said reduced aspect ratio contact hole with a metal contact to contact said contact region in said substrate; said metal contact is formed of a three layer structure comprising a lower layer composed of Ti or TiN; a middle layer composed of an Al alloy or W; and a top layer composed of TiN.

4. The method of claim 1 wherein said first insulating layer is composed of a material selected from the group consisting of silicon oxide; doped silicon oxide, phosphosilicate glass, and borophosphosilicate glass.

5. The method of claim 1 wherein said first barrier layer is composed of silicon nitride (SiN); and
    said first barrier layer has a thickness in a range of between about 400 and 2000 Å.

6. The method of claim 1 wherein said upper contact hole having a depth in a range of between about 1000 and 8000 Å and a width in a range of between about 0.3 and 1.0 µm.

7. The method of claim 1 wherein said second barrier layer composed of silicon nitride and has a thickness in a range of between about 400 and 2000 Å.

8. The method of claim 1 wherein said lower contact hole has a width in a range of between about 0.2 and 0.5 µm; and a depth in a range of between about 1000 and 8000 Å.

9. A method of fabricating a metal contact in a reduced aspect ratio contact hole to a substrate of a semiconductor device comprising the steps of:
    a) forming a first insulating layer over a semiconductor substrate; said substrate having a contact region where said metal contact will be formed;
        (1) said first insulating layer is composed of a material selected from the group consisting of silicon oxide; doped silicon oxide, phosphosilicate glass, and borophosphosilicate glass;

b) forming a first barrier layer over said first insulating layer; said first barrier layer having a first barrier opening over said contact region;
   (1) said first barrier layer is composed of silicon nitride (SiN); and said first barrier layer has a thickness in a range of between about 400 and 2000 Å;
c) anisotropically etching said first insulating layer through said first barrier opening forming an upper contact hole; said upper contact hole defined by sidewalls of said first insulating layer; said upper contact hole extends partially through said first insulating layer;
   (1) said upper contact hole having a depth in a range of between about 1000 and 8000 Å and a width in a range of between about 0.3 and 1.0 $\mu$m;
d) forming a second barrier layer on said first barrier layer and said first insulating layer;
   (1) said second barrier layer composed of silicon nitride and having a thickness in a range of between about 400 and 2000 Å;
e) anisotropically etching said second barrier layer forming spacers on said sidewalls of said first insulating layer;
f) anisotropically etching said first insulating layer using said first barrier layer and said spacers as an etch mask forming a lower contact hole; said lower contact hole exposing said contact region of said substrate;
   (1) said lower contact hole has a width in a range of between about 0.2 and 0.5 $\mu$m; and a depth in a range of between about 1000 and 8000 Å;
g) removing said first barrier layer and said spacers; said upper contact hole and said lower contact hole comprise said reduced aspect ratio contact hole;
h) filling said reduced aspect ratio contact hole with a metal contact to contact said contact region in said substrate; said metal contact formed of a three layer structure comprising a lower layer composed of Ti or TiN; a middle layer composed of an Al alloy or W; and a top layer composed of TiN.

10. A method of fabricating a metal contact to a substrate of a semiconductor device comprising the steps of:
   a) forming a first insulating layer over a substrate; said substrate having a contact region where said metal contact will be formed;
   b) forming a first barrier layer over said first insulating layer; said first barrier layer having a first barrier opening over said contact region;
   c) anisotropically etching said first insulating layer through said first barrier opening forming an upper contact hole;
   d) forming a second barrier layer on said first barrier layer and said first insulating layer;
   e) anisotropically etching said second barrier layer forming first spacers on sidewalls of said first insulating layer;
   f) anisotropically etching said first insulating layer using said first barrier layer and said first spacers as an etch mask forming a middle contact hole;
   g) forming a third barrier layer over said first barrier layer; said first spacers and said first insulating layer;
   h) anisotropically etching said third barrier layer forming second spacers on said first spacers and on sidewalls of said first insulating layer in said middle contact hole;
   i) anisotropically etching said first insulating layer using said first barrier layer, said first spacers, and said second spacers as etch mask forming a bottom contact hole; said bottom contact hole exposing said contact region of said substrate;
   j) removing said first barrier layer, said first spacers; and said second spacers forming a reduced aspect ratio contact hole exposing said substrate;
   k) forming a metal contact filling said reduced aspect ratio contact hole contacting said substrate.

11. The method of claim 10 wherein said first insulating layer is composed of a material selected from the group consisting of silicon oxide; doped silicon oxide, phosphosilicate glass, and borophosphosilicate glass.

12. The method of claim 10 wherein said upper contact hole has a depth in a range of between about 1000 and 8000 Å; and a width in a range of between about 0.4 and 1.0 $\mu$m.

13. The method of claim 10 wherein said first barrier layer is composed silicon nitride (SiN), and said first barrier layer having a thickness in a range of between about 400 and 2000 Å.

14. The method of claim 10 wherein said second barrier layer is composed of silicon nitride and has a thickness in a range of between about 400 and 2000 Å.

15. The method of claim 10 wherein said middle contact hole having a depth in a range of between about 1000 and 8000 Å; said middle contact hole having a width in a range of between about 0.4 and 0.8 $\mu$m.

16. The method of claim 10 wherein said bottom contact hole has a width in a range of between about 0.2 and 0.5 $\mu$m; and a depth in a range of between about 1000 and 8000 Å.

17. The method of claim 10 wherein said metal contact is formed of a three layer structure comprising a lower layer composed of Ti or TiN; a middle layer composed of an Al alloy or W; and a top layer composed of TiN.

18. A method of fabricating a metal contact to a substrate of a semiconductor device comprising the steps of:
   a) forming a first insulating layer over a semiconductor substrate; said substrate having a contact region where said metal contact will be formed;
      (1) said first insulating layer is composed of a material selected from the group consisting of silicon oxide; doped silicon oxide, phosphosilicate glass, and borophosphosilicate glass;
   b) forming a first barrier layer over said first insulating layer; said first barrier layer having a first barrier opening over said contact region;
      (1) said first barrier layer is composed silicon nitride (SiN), and said first barrier layer having a thickness in a range of between about 400 and 2000 Å;
   c) anisotropically etching said first insulating layer through said first barrier opening forming an upper contact hole; said upper contact hole having a depth in a range of between about 1000 and 8000 Å and a width in a range of between about 0.4 and 1.0 $\mu$m;
   d) forming a second barrier layer on said first barrier layer and said first insulating layer;
      (1) said second barrier layer is composed of silicon nitride and has a thickness in a range of between about 400 and 2000 Å;
   e) anisotropically etching said second barrier layer forming first spacers on sidewalls of said first insulating layer;
   f) anisotropically etching said first insulating layer using said first barrier layer and said first spacers as an etch mask forming a middle contact hole;

(1) said middle contact hole having a depth in a range of between about 1000 and 8000 Å; said middle contact hole having a width in a range of between about 0.4 and 0.8 µm;

g) forming a third barrier layer over said first barrier layer; said first spacers and said first insulating layer;

h) anisotropically etching said third barrier layer forming second spacers on said first spacers and on sidewalls of said first insulating layer in said middle contact hole;

i) anisotropically etching said first insulating layer using said first barrier layer, said first spacers, and said second spacers as etch mask forming a bottom contact hole; said bottom contact hole exposing said contact region of said substrate;

(1) said bottom contact hole having a width in a range of between about 0.2 and 0.5 µm; and a depth in a range of between about 1000 and 8000 Å;

j) removing said first barrier layer, said first spacers; and said second spacers; whereby said upper contact hole, said middle contact hole and said bottom contact hole comprise a reduced aspect ratio contact hole exposing said substrate;

k) forming a metal contact filling said reduced aspect ratio contact hole contacting said substrate; said metal contact is formed of a three layer structure comprising a lower layer composed of Ti or TiN; a middle layer composed of an Al alloy or W; and a top layer composed of TiN.

* * * * *